US010958870B2

(12) United States Patent
Jones et al.

(10) Patent No.: US 10,958,870 B2
(45) Date of Patent: Mar. 23, 2021

(54) CABLE TELEVISION MULTI-TAP SYSTEM

(71) Applicant: PPC BROADBAND, INC., East Syracuse, NY (US)

(72) Inventors: Douglas Jones, Cicero, NY (US); Noah Montena, Syracuse, NY (US); Andriy Lozhko, East Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 16/502,449

(22) Filed: Jul. 3, 2019

(65) Prior Publication Data
US 2020/0036938 A1 Jan. 30, 2020

Related U.S. Application Data
(60) Provisional application No. 62/703,597, filed on Jul. 26, 2018.

(51) Int. Cl.
| *H01P 5/18* | (2006.01) |
| *H03H 9/74* | (2006.01) |
| *H04N 7/10* | (2006.01) |
| *H05K 5/03* | (2006.01) |
| *H05K 5/02* | (2006.01) |
| *H05K 5/00* | (2006.01) |

(52) U.S. Cl.
CPC ............... *H04N 7/106* (2013.01); *H01P 5/18* (2013.01); *H05K 5/0008* (2013.01); *H05K 5/0047* (2013.01); *H05K 5/0247* (2013.01); *H05K 5/03* (2013.01)

(58) Field of Classification Search
CPC .......... H01P 5/18; H03H 9/74; H01R 9/0509; H01R 13/5212; H01R 24/547; H01R 31/02; H01R 43/26
USPC .................................................. 333/109, 112
See application file for complete search history.

(56) References Cited

U.S. PATENT DOCUMENTS

| 4,578,702 | A | 3/1986 | Campbell |
| 5,169,013 | A | 12/1992 | Lammens, Jr. |
| 5,850,165 | A | 12/1998 | Spriester et al. |
| 6,133,939 | A * | 10/2000 | Gresko ................. H04N 7/104 725/127 |
| 6,292,371 | B1 | 9/2001 | Toner, Jr. |
| 6,570,465 | B2 | 5/2003 | Tang |
| 6,580,336 | B1 | 6/2003 | Gersberg et al. |
| 10,784,597 | B2 * | 9/2020 | Jones ..................... H04N 7/104 |
| 2002/0067222 | A1 | 6/2002 | Tang |

(Continued)

OTHER PUBLICATIONS

Lee W. Young, International Search Report and Written Opinion dated Sep. 26, 2019, PCT Application No. PCT/US2019/040508, 16 pages.

*Primary Examiner* — Dean O Takaoka
(74) *Attorney, Agent, or Firm* — MH2 Technology Law Group LLP

(57) ABSTRACT

A cable television (CATV) multi-tap system includes a tap housing. The system also includes a face plate including one or more subscriber ports. The system also includes a circuit board positioned within the tap housing and coupled to the face plate. The system also includes an access cover coupled to the tap housing. The access cover is configured to be removed from the tap housing to allow access to the circuit board without removing the face plate or the circuit board from the tap housing.

6 Claims, 4 Drawing Sheets

(56) References Cited

U.S. PATENT DOCUMENTS

2015/0067755 A1\* 3/2015 Conroy .............. H04N 21/6156
725/127

\* cited by examiner

CABLE TELEVISION MULTI-TAP SYSTEM

CROSS-REFERENCE TO RELATED APPLICATIONS

This application claims priority to U.S. Provisional Patent Application No. 62/703,597, filed on Jul. 26, 2019, which is incorporated by reference herein.

BACKGROUND

In cable television (CATV) and broadband networks, signals can be transmitted bi-directionally between a head-end and potentially many remote, subscriber premises. The networks employ a variety of devices to deliver and condition such signals to enhance quality and performance of the signal transmission.

One type of device that is employed in the networks is a tap (also referred to as a multi-tap). A tap is connected to a main input cable (e.g., CATV hardline), which continues past the tap or may be terminated at the tap. The tap also provides one or more subscriber ports. A drop cable leading to a subscriber premises may be connected to each of the subscriber ports.

The tap may include a plug-in module that provides signal conditioning. For example, in upstream signals (also referred to as return signals) proceeding from the subscriber premises toward the head-end, ingress noise can be received from various sources. If left unconditioned, this noise from disparate sources can combine and affect the operation of the network, e.g., the return signal devices thereof. Additionally, signal equalization, cable simulation, and other signal conditioning characteristics may also be desirable at the taps for the downstream signals (also referred to as forward signals), which proceed from the head-end to the subscribers. The level of attenuation and/or other conditioning characteristics best suited to the signal can change depending on the location of the tap in the network.

The tap may also include a directional coupler that provides a desired level of attenuation for the signals tapped off to the subscribers (a "tap value"). The directional coupler may be removably coupled to a printed circuit board that is (e.g., permanently) coupled to a face plate. The face plate may be removably coupled to a tap housing. To change the tap value, the face plate may be removed from the tap housing, and a user (e.g., a technician) may then remove and replace the directional coupler to change the tap value. However, removing the face plate from the tap housing and subsequently removing and replacing the directional coupler may require the drop connections to the subscriber premises to be disconnected, leading to an interruption in service at the subscriber premises.

SUMMARY

A cable television (CATV) multi-tap system is disclosed. The system includes a tap housing including one or more housing ports configured to connect to a main input cable that provides a CATV signal. The system also includes a face plate that is integral with the tap housing. The face plate includes one or more subscriber ports configured to connect to one or more subscriber devices. The system also includes a circuit board positioned within the tap housing and coupled to an inner surface of the face plate. The circuit board includes a directional coupler configured control a tap value of the CATV signal. The circuit board also includes a plug-in module configured to provide signal conditioning to the CATV signal. The circuit board also includes a splitter configured to split the CATV signal between the one or more housing ports and the one or more subscriber ports. The system also includes an access cover coupled to an opposite side of the tap housing from the face plate. The access cover is configured to be removed to allow access to the circuit board to change the tap value without removing the face plate and without disconnecting connections between the one or more subscriber ports and the one or more subscriber devices.

In another embodiment, the system includes a tap housing. The system also includes a face plate that is coupled to the tap housing. The face plate includes one or more subscriber ports. The system also includes a circuit board positioned within the tap housing and coupled to the face plate. The circuit board includes a directional coupler. The system also includes an access cover coupled to the tap housing. The access cover is configured to be removed to allow the directional coupler to be removed and replaced without removing the face plate from the tap housing and without disconnecting connections between the one or more subscriber ports and one or more subscriber devices.

In another embodiment, the system includes a tap housing. The system also includes a face plate including one or more subscriber ports. The system also includes a circuit board positioned within the tap housing and coupled to the face plate. The system also includes an access cover coupled to the tap housing. The access cover is configured to be removed from the tap housing to allow access to the circuit board without removing the face plate or the circuit board from the tap housing.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

Figure 1:
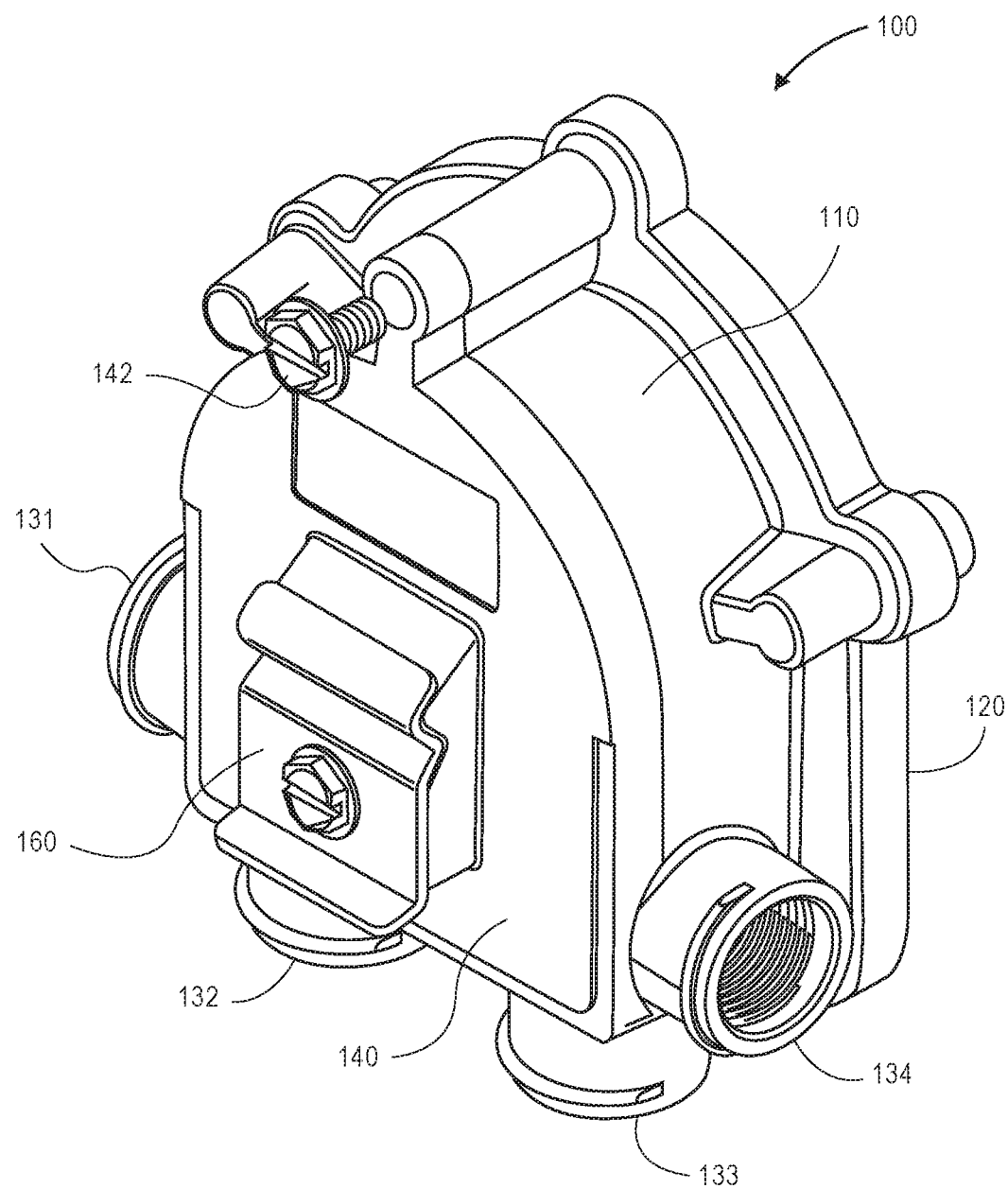
FIG. 1 illustrates a perspective view of a cable television (CATV) multi-tap system in a closed state, according to an embodiment.

FIG. 1 illustrates a perspective view of a cable television (CATV) multi-tap system 100 in a closed state, according to an embodiment. The CATV multi-tap system 100 includes a tap housing 110. The CATV multi-tap system 100 may also include a face plate 120. The face plate 120 may be located on a first (e.g., front) side/wall of the tap housing 110. In one embodiment, the face plate 120 may be permanently coupled to (e.g., non-removable and/or integral with) the tap housing 110. In at least one embodiment, one or more first ports may be mounted directly to the tap housing 110. For example, the first ports may be mounted directly to the face plate 120. The first ports may also be referred to as subscriber ports and/or F-ports. The first ports may provide connections with subscriber devices (e.g., via drop cables connected therebetween). More particularly, the first ports may be used to forward signals to a plurality of subscriber devices and to receive return signals from the subscriber devices.

The tap housing 110 may also include one or more second ports (e.g., four are shown: 131-134). The second ports 131-134 may also be referred to as housing ports and/or KS-ports. The second ports 131-134 may connect to a main input cable (e.g., CATV hardline). In at least one embodiment, only two of the four second ports 131-134 may be used at a time, e.g., depending on the installation orientation, with one serving as an input for the CATV hardline and the other serving as an output for the CATV hardline.

The CATV multi-tap system 100 may also include an access cover 140. The access cover 140 may be positioned on a second (e.g., back) side/wall of the tap housing 110, such that the access cover 140 and the face plate 120 are positioned on opposite sides of the tap housing 110. Having the access cover 140 located on the back of the tap housing 110 may allow the tap value to be changed (e.g., by removing the access cover 140 and accessing a circuit board contained within the housing 110) without having to remove the face plate 120 and/or disconnect the drop connections that are connected to the first ports, as described in greater detail below.

Figure 2:
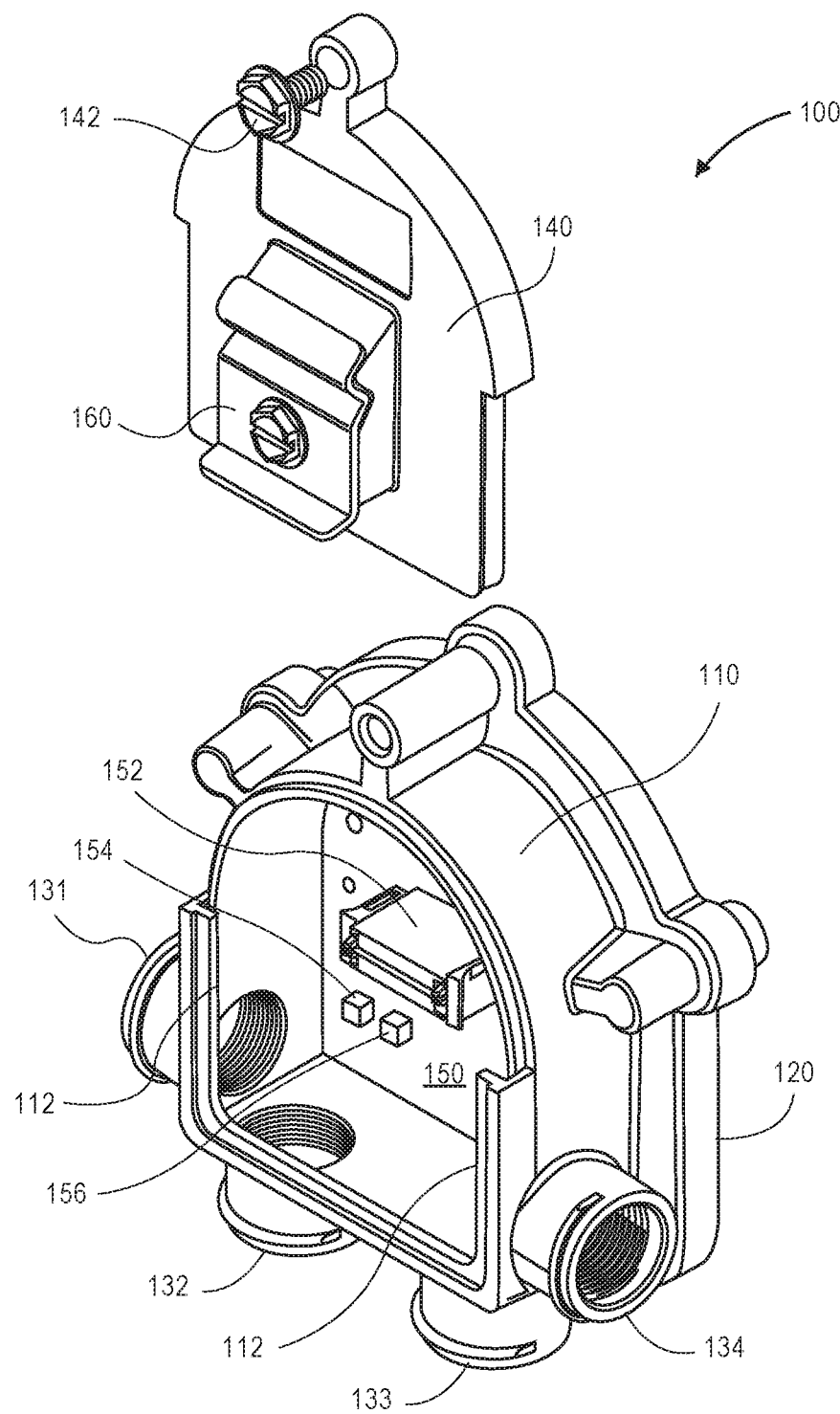
FIG. 2 illustrates a perspective view of the CATV multi-tap system in an open state, according to an embodiment.
Figure 3:
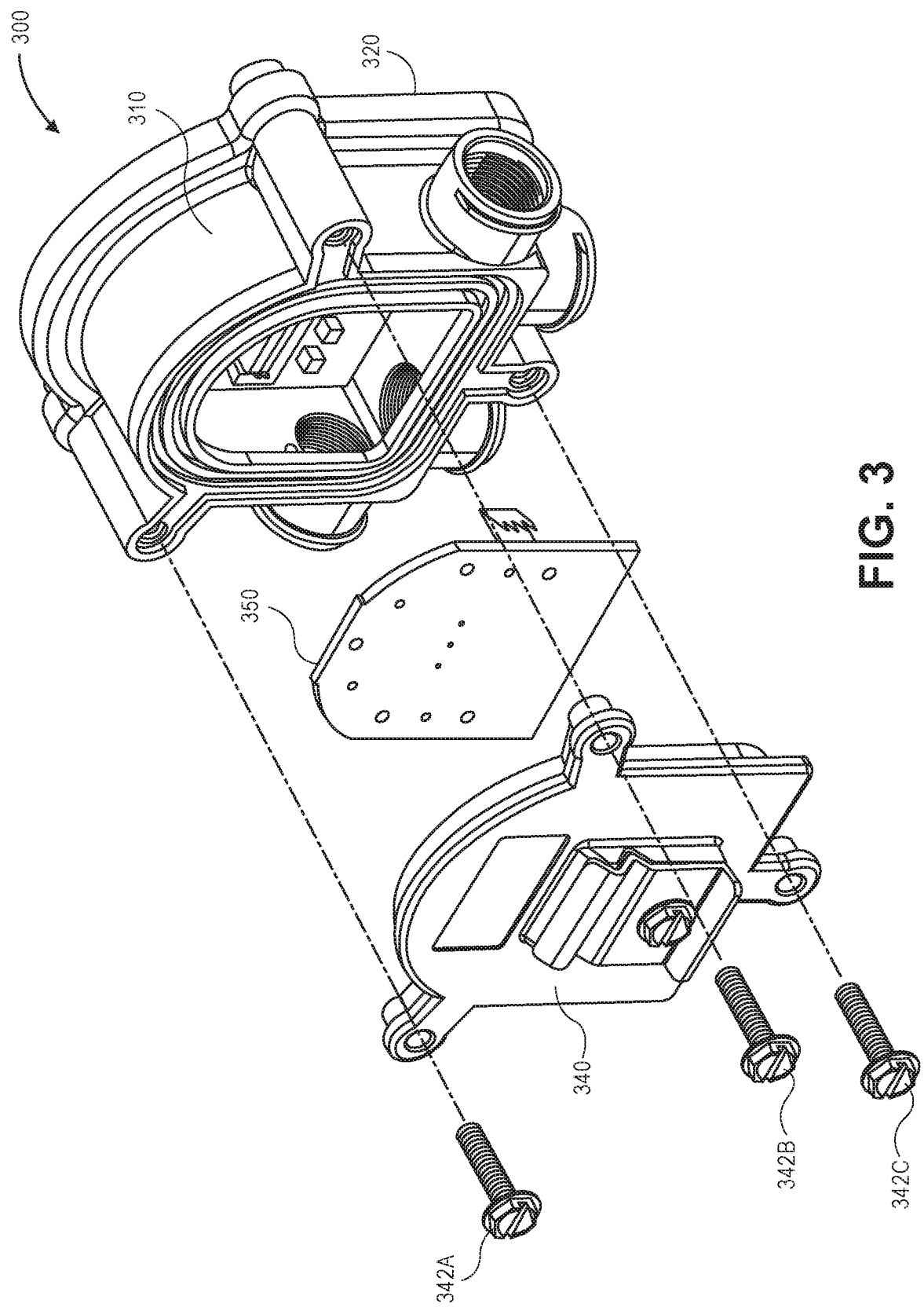
FIG. 3 illustrates an exploded view of a different CATV multi-tap system, according to an embodiment.

The CATV multi-tap system 100 is in the closed state when the access cover 140 is coupled to the tap housing 110, as shown in FIG. 1. The CATV multi-tap system 100 may be secured in the closed state by one or more fasteners (e.g., bolts or screws—one is shown) 142. As shown in FIGS. 2 and 3 and described in greater detail below, the access cover 140 may be removable (i.e., decoupled from and/or recoupled to the tap housing 110) to provide access to an internal volume of the tap housing 110.

A clamp 160 may be coupled to the access cover 140. The clamp 160 may secure the system 100 to a strand (e.g., a cable) or a pedestal (e.g., a bracket) that may be configured to support two or more devices.

FIG. 2 illustrates a perspective view of the CATV multi-tap system 100 in an open state, according to an embodiment. The CATV multi-tap system 100 is in the open state when the access cover 140 is de-coupled and/or removed from the tap housing 110. As shown, the tap housing 110 may include inwardly-extending flanges 112 that may define a slot into/through which the access cover 140 may slide. More particularly, to open the CATV multi-tap system 100, the fastener(s) 142 may first be removed. Then, the access cover 140 may slide (e.g., upward) through the slot to provide access to the internal volume. The flanges 112 may prevent the access cover 140 from moving laterally-away from the tap housing 110 when the access cover 140 is at least partially positioned in the slot. As a result, in at least one embodiment, a single fastener 142, in combination with the flanges 112, may be sufficient to secure the CATV multi-tap system 100 in the closed state. In at least one embodiment, lip structures (e.g., seals) at the top and/or bottom edges of the tap housing 110 and/or access cover 140 may be configured to seal the top and/or bottom of the tap housing 110 relative to the access cover 140.

A circuit board 150 may be positioned within the internal volume of the tap housing 110. The circuit board 150 may be connected to the tap housing 110. For example, the circuit board 150 may be connected to the inner surface of the non-removable face plate 120 via one or more (e.g., two) single pin connectors on the non-removable face plate 120, which may provide the main CATV signal in and the main CATV signal out. The circuit board 150 may also or instead be connected to the non-removable face plate 120 via a multi-pin connector to connect the first ports.

The circuit board 150 may include a plug-in module 152, a directional coupler 154, and/or a splitter 156. As mentioned above, the plug-in module 152 may be configured to provide signal conditioning to the upstream portion of the CATV signal and/or the downstream portion of the CATV signal. The plug-in module 152 may be configured to be removed and replaced to change the signal conditioning.

The directional coupler 154 may be configured to provide and/or control a desired level of attenuation for the CATV signal (e.g., the "tap value") tapped off to the first ports and/or the subscriber devices. The splitter 156 may be configured to split the downstream portion of the CATV signal for transmission to the plurality of subscriber devices. The splitter 156 may also be configured to combine the upstream portion of the CATV signal for transmission toward the head-end.

A technician may remove the access cover 140 to gain access to the circuit board 150 without removing the circuit board 150 from the tap housing 110 and/or without interrupting service to the subscriber devices. Once the access cover 140 has been removed, the technician can subsequently remove and replace the directional coupler 154 (with a different directional coupler) to change the tap value. The tap value may not be changed unless/until the directional coupler 154 is removed and/or replaced. In at least one embodiment, the remainder of the circuit board 150 (e.g., the plug-in module 152 and/or the splitter 156) may remain positioned within the tap housing 110 (e.g., coupled to the face plate 120) while the directional coupler 154 is being removed and replaced.

Thus, the technician may access the circuit board 150 and change the tap value without disconnecting the CATV main cable from the one or more second ports 131-134 and without disconnecting the connections between the first (subscriber) ports and the subscriber devices. The subscriber devices may only have service interrupted for a brief time (e.g., a few seconds) during which the directional coupler 154 is being replaced. As will be appreciated, this interruption in service may have a much shorter duration when compared to conventional CATV multi-tap systems where the circuit board is coupled to a removable face plate, and the face plate is removed to change the directional coupler 154. In another embodiment, the circuit board 150 may include a bypass path that may allow the CATV signals to continue to be transmitted to the subscriber devices even while the directional coupler 154 is removed (i.e., service may not be interrupted at all).

Figure 4:
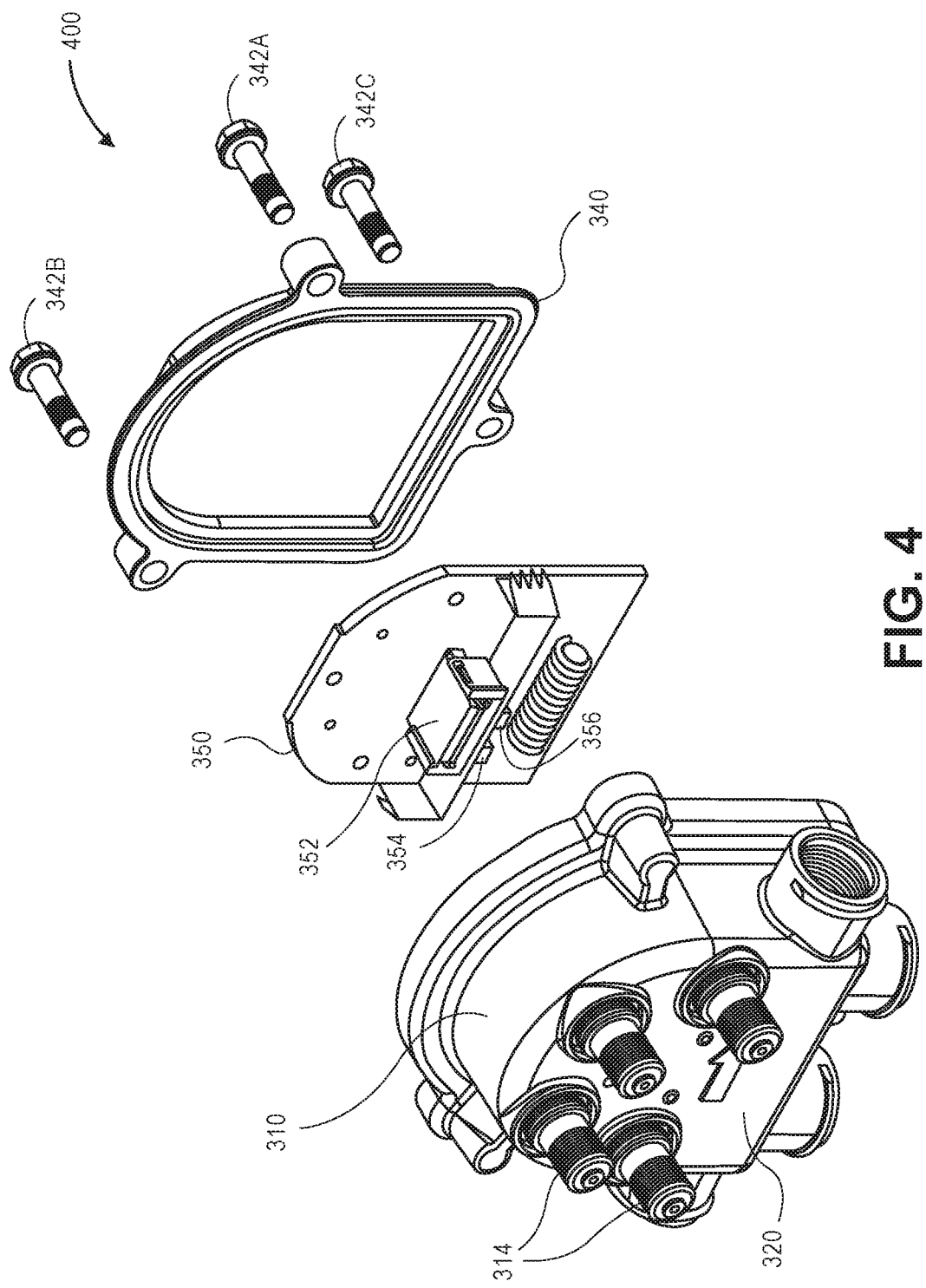
FIG. 4 illustrates an exploded view of the CATV multi-tap system of FIG. 3 taken from a different angle, according to an embodiment.

FIGS. 3 and 4 illustrate exploded views of another CATV multi-tap system 300, according to an embodiment. Similar to the system 100, the system 300 may include a tap housing 310, a face plate 320, an access cover 340, and a circuit board 350. The circuit board 350 may include a removable directional coupler 354. One or more first ports 314 (e.g., subscriber ports, also known as F-ports) may be mounted directly to the tap housing 310 (e.g., the non-removable face plate 320).

In this embodiment, however, the tap housing 310 does not include flanges that define a slot. Rather, the access cover 340 may be coupled to the tap housing 310 via a plurality of fasteners (three are shown: 342A-C). In this embodiment, once the fasteners 342A-C are removed, the access cover 340 may be moved laterally-away from the tap housing 110 to provide access to the internal volume.

In another embodiment, rather than using fasteners 142, 342A-C, the access cover 140, 340 may be secured in the closed state via a snap-fit arrangement, a tongue-in-groove arrangement, or the like with the tap housing 110, 310. For example, rather than having the flanges 112 be vertical, the flanges 112 may be horizontal. In this example, the lip structure(s) may be present at the sides of the tap housing 110, 310 and/or access cover 140, 340 may be configured to seal the sides of the tap housing 110, 310 relative to the access cover 140, 340. In another example, the flanges 112 and slot may be reversed. In other words, the flanges and slot may be formed in the access cover 140, 340.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A cable television (CATV) multi-tap system, comprising:
    a tap housing comprising one or more housing ports configured to connect to a main input cable that provides a CATV signal, wherein the tap housing comprises one or more flanges that define a slot;
    a face plate that is integral with the tap housing, wherein the face plate comprises one or more subscriber ports configured to connect to one or more subscriber devices;
    a circuit board configured to be positioned within the tap housing, wherein the circuit board is configured to be connected to an inner surface of the face plate;
    a directional coupler configured to be positioned within the tap housing, wherein the directional coupler is configured control a tap value of the CATV signal;
    a plug-in module configured to be positioned within the tap housing, wherein the plug-in module is configured to provide signal conditioning to the CATV signal;
    a splitter configured to be positioned within the tap housing, wherein the splitter is configured to split the CATV signal between the one or more housing ports and the one or more subscriber ports; and
    an access cover configured to be connected to an opposite side of the tap housing from the face plate to cover an opening in the tap housing, wherein the access cover is configured to slide through the slot to be removed to insert the circuit board, the directional coupler, the plug-in module, and the splitter into the tap housing through the opening.

2. The CATV multi-tap system of claim 1, wherein the access cover is configured to slide through the slot to be removed to remove the circuit board, the directional coupler, the plug-in module, and the splitter from the tap housing through the opening.

3. The CATV multi-tap system of claim 1, wherein the access cover is configured to slide through the slot to be removed to replace the directional coupler with another directional coupler to change the tap value.

4. The CATV multi-tap system of claim 3, wherein the directional coupler is configured to be replaced without removing the face plate from the tap housing.

5. The CATV multi-tap system of claim 4, wherein the directional coupler is configured to be replaced without disconnecting the one or more subscriber ports from the one or more subscriber devices.

6. The CATV multi-tap system of claim 1, wherein the face plate is not configured to be removed from the tap housing.

\* \* \* \* \*